United States Patent
Ahiko et al.

(10) Patent No.: US 6,292,351 B1
(45) Date of Patent: Sep. 18, 2001

(54) MULTILAYER CERAMIC CAPACITOR FOR THREE-DIMENSIONAL MOUNTING

(75) Inventors: Taisuke Ahiko, Akita-ken; Masaaki Togashi, Tokyo, both of (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 09/611,310

(22) Filed: Jul. 6, 2000

(30) Foreign Application Priority Data

| Nov. 17, 1999 | (JP) | 11-326890 |
| Nov. 26, 1999 | (JP) | 11-336459 |
| Nov. 26, 1999 | (JP) | 11-336550 |
| Nov. 29, 1999 | (JP) | 11-337579 |

(51) Int. Cl.$^7$ .................................. H01G 4/228
(52) U.S. Cl. .................... 361/306.3; 361/306.3; 361/321.2; 361/319; 361/308.1
(58) Field of Search ................ 361/306.1, 303, 361/308.1, 313, 321.2, 305, 310, 309, 322, 329

(56) References Cited

U.S. PATENT DOCUMENTS

| 4,831,494 | * | 5/1989 | Arnold et al. | 361/306 |
| 5,369,545 | * | 11/1994 | Bhattacharyya et al. | 361/306.2 |
| 5,880,925 | * | 3/1999 | DePre' et al. | 361/303 |

FOREIGN PATENT DOCUMENTS

| 57-60827 | 4/1982 | (JP) . |
| 62-32257 | 8/1987 | (JP) . |
| 63-38856 | 8/1988 | (JP) . |
| 64-10927 | 2/1989 | (JP) . |
| 2657953 | 1/1994 | (JP) . |
| 6-7228 | 1/1994 | (JP) . |
| 7-161568 | 6/1995 | (JP) . |
| 7-169649 | 7/1995 | (JP) . |
| 7-169651 | 7/1995 | (JP) . |
| 7-272975 | 10/1995 | (JP) . |
| 8-124800 | 5/1996 | (JP) . |
| 9-148174 | 6/1997 | (JP) . |

* cited by examiner

Primary Examiner—Dean A. Reichard
Assistant Examiner—Nguyen T Ha
(74) Attorney, Agent, or Firm—Oliff & Berridge, PLC

(57) ABSTRACT

A multiterminal multilayer ceramic capacitor having a capacitor body comprised of first internal electrodes and second internal electrodes alternately stacked via rectangular ceramic layers so that the short sides of the ceramic layers register with the height direction of the capacitor body. First external terminals and/or second external terminals connected to the first internal electrodes and/or second internal electrodes are formed on a top face and bottom face of the capacitor body. The first external terminals and second external terminals are connected directly to different circuit patterns of the circuit board so as to enable three-dimensional mounting of the multilayer ceramic capacitor with circuit boards.

15 Claims, 8 Drawing Sheets

MULTILAYER CERAMIC CAPACITOR FOR THREE-DIMENSIONAL MOUNTING

BACKGROUND OF THE INVENTION

1. Field of the Invention

The present invention relates to a multilayer ceramic capacitor for three-dimensional mounting suitable for mounting in a personal computer or other electronic apparatus with a high operating frequency as a low equivalent serial inductance (ESL) and low equivalent serial resistance (ESR) capacitor and suitable for mounting on a three-dimensional multilayer printed circuit board.

2. Description of the Related Art

In the past, as multiterminal multilayer ceramic capacitors, for example the capacitor disclosed in U.S. Pat. No. 5,880,925 is known. This capacitor has a capacitor body which has two types of, that is, first and second, internal electrodes and dielectric layers stacked to sandwich them. Each of these internal electrodes is formed with a rectangular main portion pattern extending in the longitudinal direction on a face of a rectangular ceramic layer and a plurality of lead patterns extending from the sides of the main portion to the sides of the ceramic layer. The lead patterns of the first internal electrodes and the lead patterns of the second internal electrodes are formed at different positions from each other when seen from a plan view. A plurality of external electrodes are formed at the side faces of the long and short sides of the capacitor body of this multiterminal multilayer ceramic capacitor.

This multiterminal multilayer ceramic capacitor is placed on the surface of a circuit board so that the external electrodes are positioned in a standing direction from the surface of the circuit board. The stacking direction of the internal electrodes and the ceramic layers are substantially vertical to the circuit board. The external electrodes are joined and fixed by soldering to the lands of the circuit pattern of the circuit board so as to mount the capacitor on the surface of the circuit board.

In this type of multilayer ceramic capacitor, however, since the stacking direction of the internal electrodes and the ceramic layers is made to register with the height direction of the capacitor for the surface mounting, if the number of ceramic layers stacked is increased from the electrical characteristics required, the height of the electronic devices cannot be kept low.

Note that as multilayer electronic devices for surface mounting by bringing the stacking direction of the ceramic layers into register with the height direction of the multilayer electronic device, in addition to the one of U.S. Pat. No. 5,880,925, there are many known such as those disclosed in Japanese Examined Patent Publication (Kokoku) No. 64-10927, Japanese Unexamined Patent Publication (Kokai) No. 7-161568, Japanese Unexamined Patent Publication (Kokai) No. 7-169649, Japanese Unexamined Patent Publication (Kokai) No. 7-169651, Japanese Unexamined Patent Publication (Kokai) No. 7-272975, Japanese Unexamined Patent Publication (Kokai) No. 8-124800, Japanese Unexamined Patent Publication (Kokai) No. 9-148174, Japanese Unexamined Utility Model Publication (Kokai) No. 6-7228, Japanese Examined Patent Publication (Kokoku) No. 62-35257, and Japanese Examined Patent Publication (Kokoku) No. 63-38856. In a multilayer electronic device for surface mounting by bringing the stacking direction of the ceramic layers into register with the height direction of the multilayer electronic device, there is the problem that, if the number of ceramic layers stacked is increased from the electrical characteristics required, it is not possible to keep low the height of the electronic device.

In personal computers and other electronic apparatuses, however, the operating frequency has increased from 500 MHz to 1 GHz. The power supply circuit is required to be a low ESL and low ESR multilayer ceramic capacitor. Further, in view of the increasingly smaller sizes of electronic apparatuses, a multiterminal multilayer ceramic capacitor which keeps the height dimension low, enables reliable surface mounting on a three-dimensional printed circuit board etc., and gives predetermined characteristics has been demanded.

If three-dimensionally mounting a conventional multiterminal multilayer ceramic capacitor on a three-dimensional multilayer printed circuit board etc., however, the circuit pattern formed on the circuit board becomes longer, the detouring of the lands becomes longer, and there is a detrimental effect on the inductance component. In particular, a circuit pattern comprised of lands at upper positions and lands at lower positions becomes longer, the detouring of the lands becomes longer and has a detrimental effect on the inductance component, and generation of noise becomes unavoidable.

Further, if surface mounting the conventional capacitor near the terminals of a semiconductor etc. to lower the ESL, there is the problem that the effect of the inductance component due to the detouring of the lands cannot be ignored. Further, in a conventional capacitor, as explained above, the height dimension of the capacitor itself cannot be kept low no matter what the number of layers stacked. From this, the conventional capacitor is not suited for three-dimensional mounting.

Note that as shown in Japanese Unexamined Patent Publication (Kokai) No. 57-60827 (corresponding to U.S. patent application Ser. No. 167,191 filed on Jul. 9, 1980) and Japanese Patent No. 2657953 (corresponding to U.S. patent application Ser. No. 212,361 filed on Jun. 27, 1988), a capacitor in which the stacking direction of the ceramic layers is brought into register with the planar direction of the circuit board on which the multilayer ceramic capacitor is to be surface mounted has been proposed. The capacitors disclosed in these publications, however, has the problems that the capacitors cannot be three-dimensionally mounted and the ESR and/or ESL of the external circuits connected to the capacitors easily become large.

SUMMARY OF THE INVENTION

An object of the present invention is to provide a multilayer ceramic capacitor for three-dimensional mounting suitable for mounting in a personal computer or other electronic apparatus with a high operating frequency as a low ESL and low ESR capacitor, enabling the height dimension to be kept low regardless of the number of ceramic layers, and suitable for mounting on a three-dimensional multilayer printed circuit board.

To achieve the object, the first capacitor according to the present invention comprises a ceramic layer formed in a rectangular shape; a first internal electrode having a rectangular first main portion extending along a longitudinal direction in a first face of the ceramic layer and having a plurality of first leads extending from long sides of the first main portion to long sides of the ceramic layer; a second internal electrode having a second main portion opposing against the first main portion of the first internal electrode across the ceramic layer and locating in a second face of the ceramic layer opposite to the first face and having a plurality of second leads extending from long sides of the second main portion at positions different from the first leads provided at the first internal electrode to the long sides of the ceramic layer; a rectangular parallelopiped shaped capacitor body comprised of a plurality of first internal electrodes and second internal electrodes stacked via ceramic layers so that the short sides of the ceramic layers register with the height direction of the capacitor body; first external electrodes formed at a top face and bottom face of the capacitor body and electrically connected to first leads positioned in the same lines along the stacking direction of the ceramic layers; second external electrodes alternately formed with respect to the first external electrodes at the top face and bottom face of the capacitor body and electrically connected to second leads positioned in the same lines along the stacking direction of the ceramic layers.

In the first capacitor of the present invention, preferably the first external electrodes are connected to a first circuit pattern outside of the capacitor body and the second external electrodes are connected to a second circuit pattern different from the first circuit pattern.

The first capacitor of the present invention is preferably buried in a three-dimensional circuit board.

According to the first capacitor according to the present invention, it is possible to shorten the height dimension of the capacitor body regardless of the number of ceramic layers stacked. As a result, it is possible to shorten the distance between the external electrodes formed on the top face of the capacitor body and the external electrodes formed on the bottom face and possible to reduce the total inductance due to detouring of the lands even if the capacitor is placed on a multilayer board. Further, the lands formed on the multilayer board can be simplified. Therefore, the capacitor is suited for mounting in personal computers and other electronic apparatuses with high operating frequencies as a low ESL and low ESR capacitor. Further, the capacitor is structured to have a low height dimension and have electrodes on the top and bottom faces of the capacitor, is suitable for mounting buried in a three-dimensional multilayer printed circuit board etc.

The second capacitor of the present invention comprises a ceramic layer formed in a rectangular shape; a first internal electrode having a rectangular first main portion extending along a longitudinal direction in a first face of the ceramic layer and having a first long side of the first main portion exposed along a first long side of the ceramic layer; a second internal electrode having a rectangular second main portion extending along a longitudinal direction in a second face opposite of the ceramic layer opposite to the first face and having a second long side of the second main portion exposed along a second long side of the ceramic layer; a rectangular parallelopiped shaped capacitor body comprised of a plurality of first internal electrodes and second internal electrodes stacked via ceramic layers so that the short sides of the ceramic layers register with the height direction of the capacitor body; first external electrodes formed at a top face or bottom face of the capacitor body and electrically connected to the first internal electrode exposed along the first long side of the ceramic layers; second external electrodes formed at the top face or bottom face of the capacitor body and electrically connected to the second internal electrode exposed along the second long side of the ceramic layer.

In the second capacitor of the present invention, preferably the first external electrodes are connected to a first circuit pattern outside of the capacitor body and the second external electrodes are connected to a second circuit pattern different from the first circuit pattern.

The second capacitor of the present invention is preferably buried in a three-dimensional circuit board.

The second capacitor of the present invention exhibits a similar action and effect as the first capacitor of the present invention.

The third capacitor of the present invention comprises a ceramic layer formed in a rectangular shape; a first internal electrode having a rectangular first main portion extending along a longitudinal direction in a first face of the ceramic layer and having a first long side of the first main portion exposed along a first long side of the ceramic layer; a second internal electrode having a rectangular second main portion extending along a longitudinal direction in a second face of the ceramic layer opposite to the first face and having a plurality of leads extending from a second long side of the second main portion to a second long side of the ceramic layer; a rectangular parallelopiped shaped capacitor body comprised of a plurality of first internal electrodes and second internal electrodes stacked via ceramic layers so that the short sides of the ceramic layers register with the height direction of the capacitor body; a first external electrode formed at a top face or bottom face of the capacitor body and electrically connected to the first internal electrode exposed along the first long side of the ceramic layers; second external electrodes formed at the top face or bottom face of the capacitor body and electrically connected to the leads exposed along the second long side of the ceramic layer.

In the third capacitor of the present invention, preferably the plurality of second external electrodes are arranged at the top face or bottom face of the capacitor body at a distance substantially corresponding to the short sides of the ceramic layer.

In the third capacitor of the present invention, preferably the first external electrode is connected to a first circuit pattern outside of the capacitor body and the second external electrodes are connected to a second circuit pattern different from the first circuit pattern.

The third capacitor of the present invention is preferably buried in a three-dimensional circuit board.

The third capacitor of the present invention exhibits similar actions and effects as the first capacitor of the present invention and enables realization of a three-terminal capacitor by arranging a pair of second external electrodes at the top face or bottom face of the capacitor body at a distance substantially corresponding to the short sides of the ceramic layer. In this capacitor, the pitch between the second external electrodes provided in the same plane of the ceramic body can be shortened. Therefore, even if the capacitor is mounted on a multilayer board, the total inductance due to the detouring of the lands can be reduced more and the lands formed on the multilayer board can be simplified.

The fourth capacitor of the present invention comprises a ceramic layer formed in a rectangular shape; a first internal electrode having a rectangular first main portion extending along a longitudinal direction in a first face of the ceramic layer and having two long sides of the first main portion exposed respectively along long sides of the ceramic layer; a second internal electrode having a rectangular second main portion extending along a longitudinal direction in a second face of the ceramic layer opposite to the first face and having a pair of leads respectively extending from short sides of the second main portion to short sides of the ceramic layer; a rectangular parallelopiped shaped capacitor body comprised of a plurality of first internal electrodes and second internal electrodes stacked via ceramic layers so that the short sides of the ceramic layers register with the height direction of the capacitor body; a pair of first external electrodes formed at a top face and bottom face of the capacitor body and electrically connected to the first internal electrode exposed toward the long sides of the ceramic layers; a second external electrode formed at the side faces of the capacitor body and electrically connected to the leads exposed toward the short sides of the ceramic layer.

In the fourth capacitor of the present invention, preferably the second external electrode extends in a strip along the entire circumference of the four side faces of the capacitor body.

In the fourth capacitor of the present invention, preferably the first external electrodes are connected to a first circuit pattern outside of the capacitor body and the second external electrodes are connected to a second circuit pattern different from the first circuit pattern.

In the fourth capacitor of the present invention, preferably the multilayer ceramic capacitor is buried in a three-dimensional circuit board.

In the fourth capacitor of the present invention, preferably the first external electrodes and second external electrodes are connected directly to the circuit pattern formed in the three-dimensional circuit board.

The fourth capacitor of the present invention exhibits similar actions and effects as the first capacitor of the present invention and further can realize a three-terminal capacitor. Further, when providing the capacitor through a predetermined circuit pattern of a three-dimensional circuit board and using it as a so-called through-hole type capacitor, the second external electrode formed at the side faces of the capacitor body can be directly connected to the circuit pattern passed through.

BRIEF DESCRIPTION OF THE DRAWINGS

These and other objects and features of the present invention will be explained in further detail with reference to the attached drawings, in which.

DESCRIPTION OF THE PREFERRED EMBODIMENTS

First Embodiment

Figure 1:
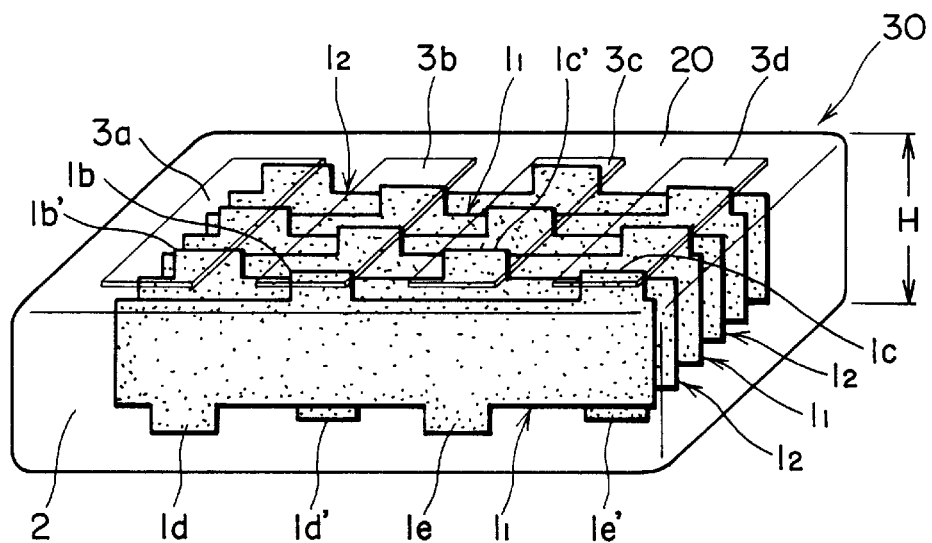
FIG. 1 is a perspective view of a multiterminal multilayer ceramic capacitor for three-dimensional mounting according to a first embodiment of the present invention in a state showing the internal structure.
Figure 2:
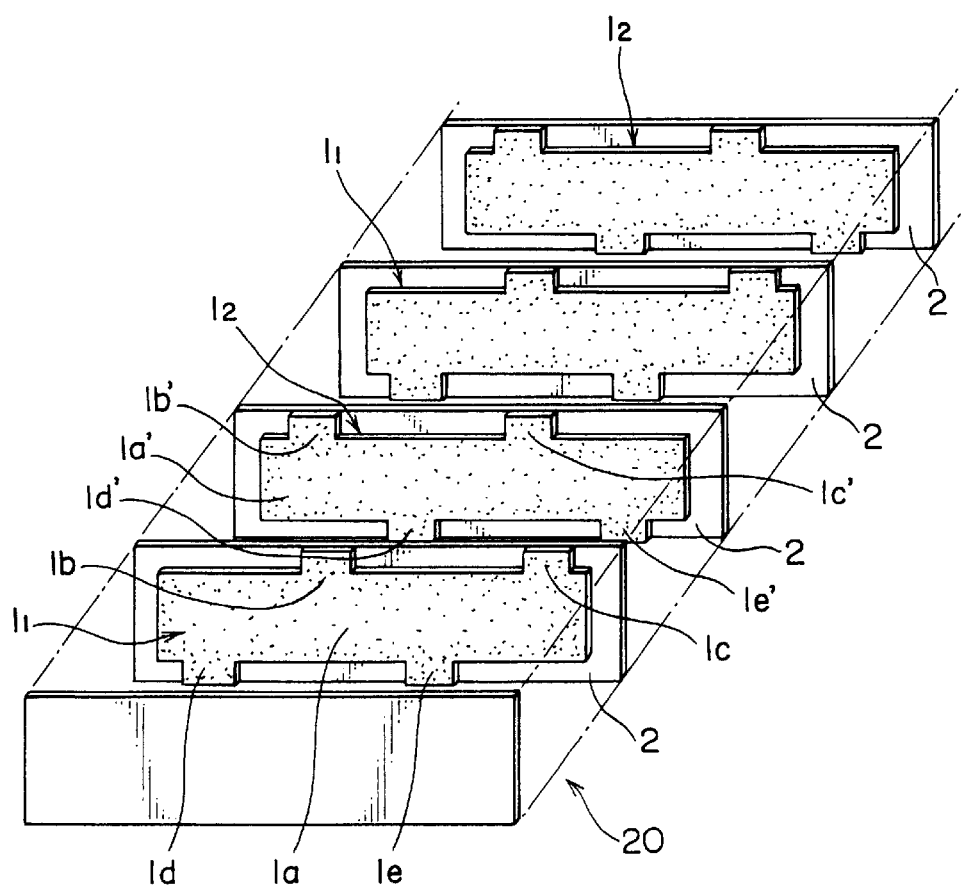
FIG. 2 is an explanatory view of the pattern shape of the internal electrodes constituting the multiterminal multilayer ceramic capacitor for three-dimensional mounting according to this embodiment.
Figure 3:
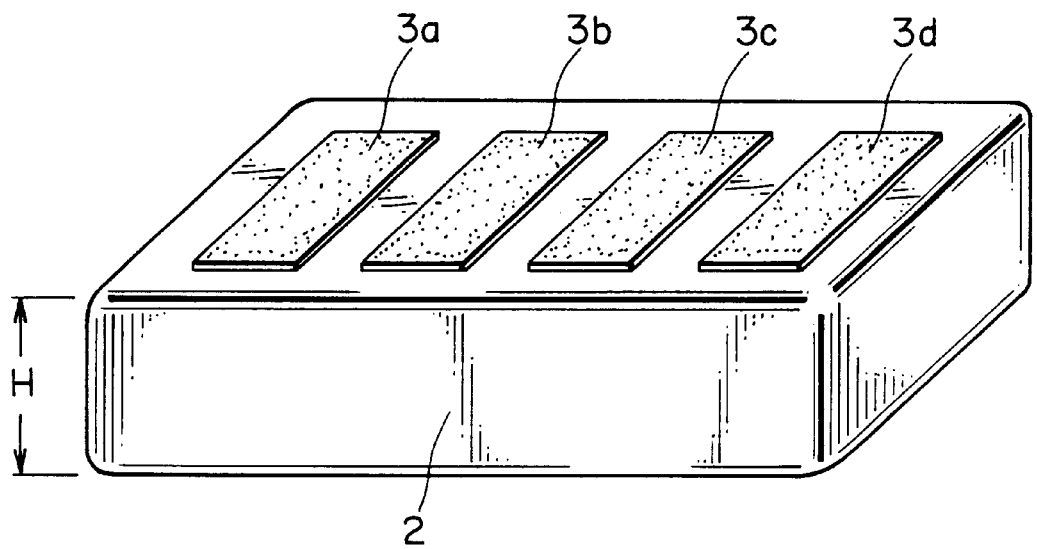
FIG. 3 is a perspective view of the appearance including external electrodes of the multiterminal multilayer ceramic capacitor for three-dimensional mounting according to this embodiment.

As shown in FIG. 1 to FIG. 3, the multiterminal multilayer ceramic capacitor 30 for three-dimensional mounting according to the present embodiment has a capacitor body 20 of a rectangular parallelopiped shape. The capacitor body 20, as shown in FIG. 2, is comprised of a plurality of first internal electrodes $1_1$ and second internal electrodes $1_2$ of predetermined patterns alternately stacked in the horizontal direction in the illustration via ceramic layers 2 formed in rectangular shapes. That is, in the present embodiment, as shown in FIG. 1, the plurality of first internal electrodes $1_1$ and second internal electrodes $1_2$ are stacked in the horizontal direction via ceramic layers 2 so that the short sides of the ceramic layers register with the height H direction of the capacitor body 20. Note that at least one ceramic layer not formed with an internal electrode may be stacked at the two end faces of the body 20 in the stacking direction.

As shown in FIG. 2, each first internal electrode $1_1$ has a rectangular first main portion $1a$ positioned at the center of a first face (surface) of the ceramic layer 2 and has a plurality of first leads $1b$, $1c$, $1d$, and $1e$ extending from the long sides of the first main portion $1a$ to the long sides of the ceramic layer 2.

Further, each second internal electrode $1_2$ has a second main portion $1a'$ of the same shape facing the first main portion $1a$ of the first internal electrode across a ceramic layer 2 in a rear surface (second face) opposite to the surface of the ceramic layer 2 and has a plurality of first leads 1$b'$, 1$c'$, 1$d'$, and 1$e'$ extending from the long sides of the second main portion 1$a'$ at positions different from the first leads 1$b$, 1$c$, 1$d$, and 1$e$ to the long sides of the ceramic layer 2.

Figure 4:
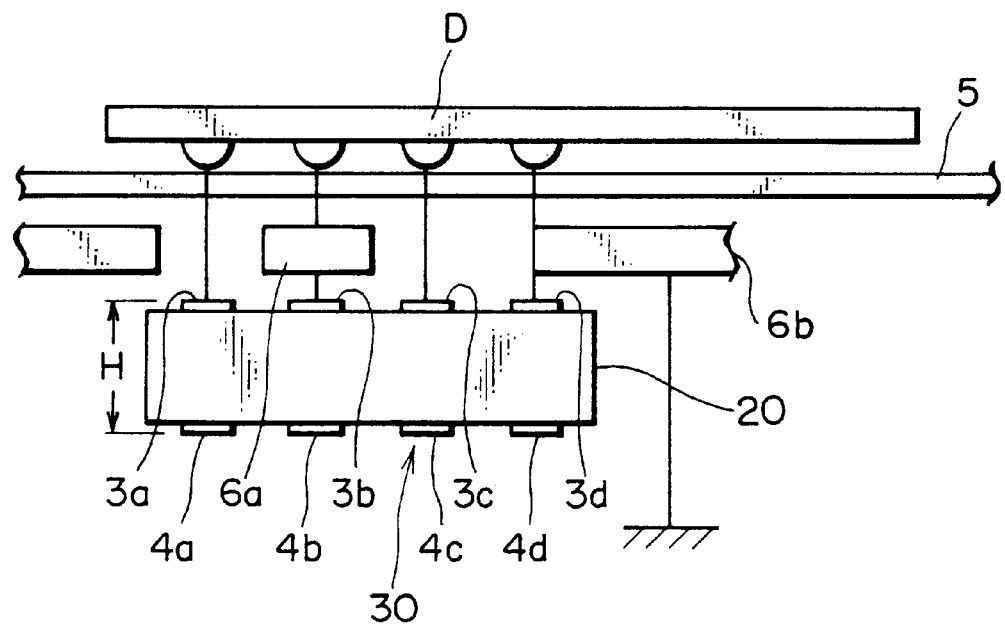
FIG. 4 is an explanatory view of a sandwiched mounting structure of a multiterminal multilayer ceramic capacitor for three-dimensional mounting according to this embodiment in a multilayer board.

As shown in FIG. 1 and FIG. 4, the top face and bottom face of the capacitor body 20 are formed with first external electrodes 3$b$, 3$d$, 4$a$, and 4$c$ electrically connected to first leads 1$b$, 1$c$, 1$d$, and 1$e$ positioned in the same line along the stacking direction of the ceramic layers 2.

The top face and bottom face of the capacitor body 20 are formed with second external electrodes 3$a$, 3$c$, 4$b$, and 4$d$ electrically connected to second leads 1$b'$, 1$c'$, 1$d'$, and 1$e'$ positioned in the same line along the stacking direction of the ceramic layers 2.

That is, as shown in FIG. 1 and FIG. 4, the first external electrodes 3$b$, 3$d$, 4$a$, and 4$c$ and the second external electrodes 3$a$, 3$c$, 4$b$, and 4$d$ are arranged at different positions from each other at the outer circumference of the capacitor body 20. Further, the first external electrodes 3$b$, 3$d$, 4$a$, and 4$c$ are connected to first internal electrodes $1_1$ of the layers through the first leads 1$b$ to 1$e$, while the second external electrodes 3$a$, 3$c$, 4$b$, and 4$d$ are connected to second internal electrodes $1_2$ of the layers through the second leads 1$b'$ to 1$e'$.

These internal electrodes $1_1$ and $1_2$ are formed by coating and baking an Ni or other conductive paste on the surface of a ceramic green sheet and are comprised of Ni or Ni alloy layers etc. Note that the internal electrodes may also be comprised of the base metal Cu, the precious metal Pd or a Pd—Ag alloy layer etc.

The ceramic layer 2 is comprised of a barium titanate-based, titanium-based, zirconate-based, or other ceramic composition. A stack of the ceramic layers 2 and internal electrodes is formed by coating a ceramic paste on a base film or other film surface to make a green sheet, printing a conductive paste on it, then stacking, cutting, and firing the green sheets. After the production of the body 20, the external electrodes are formed and baked on. The external electrodes 3$a$ to 3$d$ and 4$a$ to 4$d$ specifically can be formed by coating, drying, and baking a Cu paste on the body to form an underlayer, then covering the underlayer with an Ni and Sn plating layer.

The multilayer ceramic capacitor 30 produced in this way is used for three-dimensional mounting of multiple terminals by directly connecting the first external electrodes 3$b$, 3$d$, 4$a$, and 4$c$ and the second external electrodes 3$a$, 3$c$, 4$b$, and 4$d$ to different circuit patterns of the circuit board and supplying voltages of different polarities to the adjoining external electrodes.

The specific dimensions of the multiterminal multilayer ceramic capacitor of the present embodiment are not particularly limited, but for example are a height of 0.5±0.1 mm, a width (stacking direction) of 1.6±0.1 mm, and a length of 3.2±0.1 mm. The thickness of one ceramic layer is not particularly limited, but is for example 4 $\mu$m. The shape of the ceramic layer is that of a rectangle of short sides of 0.5±0.1 mm and long sides of 3.2±0.1 mm. The distance between the facing external electrodes positioned at the top and bottom faces of the capacitor body 20 can be set to a length substantially corresponding to the short sides of the ceramic layers 2.

The multiterminal multilayer ceramic capacitor 30 configured in this way can be mounted on a circuit board 5 of a power supply circuit provided with a semiconductor device "D" as shown in FIG. 4. This three-dimensional mounting may be performed in the following way.

That is, one set of the external electrodes 3$a$, 3$b$, 3$c$, and 3$d$ is connected with any terminal of the semiconductor device "D", while the other set of the external electrodes 4$a$, 4$b$, 4$c$, and 4$d$ is made to directly face the different circuit patterns 6$a$ and 6$b$ of the circuit board 5 and electrically connected as +poles/−poles (GND). In the three-dimensional mounting, by keeping the height dimension "H" of the part as a whole low, the detouring of the lands becomes shorter and the effect of the inductance component of the circuit side can be made smaller.

To reduce the inductance of the circuit pattern, by mounting a multilayer ceramic capacitor 30 having an ESL value of 80 to 100 pH and an ESR value of a low 10 m$\Omega$, the inductance component of the lands can be ignored. Due to this, if comparing the ESL and ESR of the multiterminal multilayer ceramic capacitor according to the prior art and the multiterminal multilayer ceramic capacitor according to the present invention having the same electrostatic capacity, the value becomes 8 percent larger in the case of use of the multiterminal multilayer ceramic capacitor according to the prior art, while can be kept a low 2 to 3 percent in the case of use of the multiterminal multilayer ceramic capacitor according to the present embodiment.

This is because in the multiterminal multilayer ceramic capacitor according to the present embodiment, since the distance between facing external electrodes can be set short and the height of the capacitor device as a whole can be reduced, even if the capacitor is mounted on a multilayer board, the total inductance due to the detouring of the lands can be reduced and the lands formed on the multilayer board can be simplified.

Second Embodiment

Figure 5:
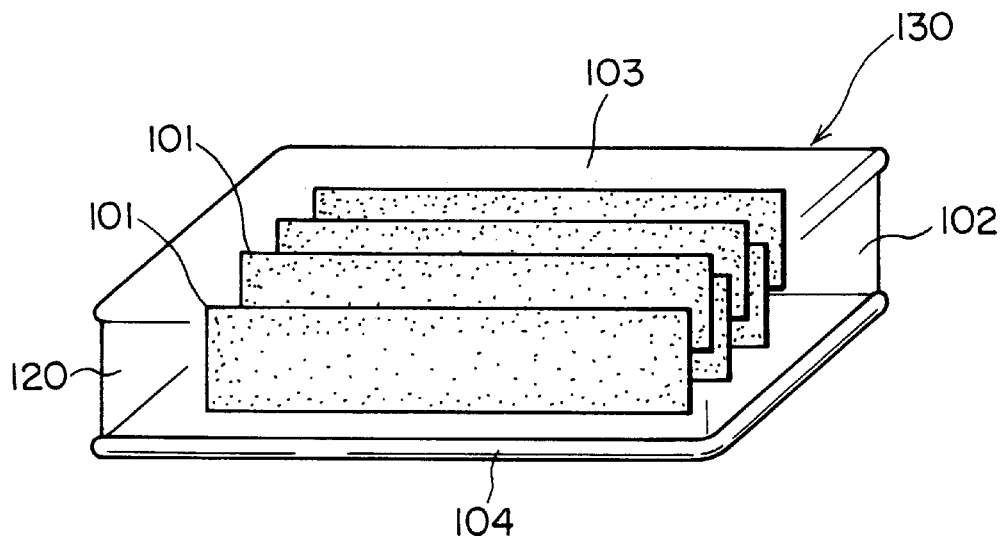
FIG. 5 is a perspective view of a multiterminal multilayer ceramic capacitor for three-dimensional mounting according to another embodiment of the present invention.
Figure 6:
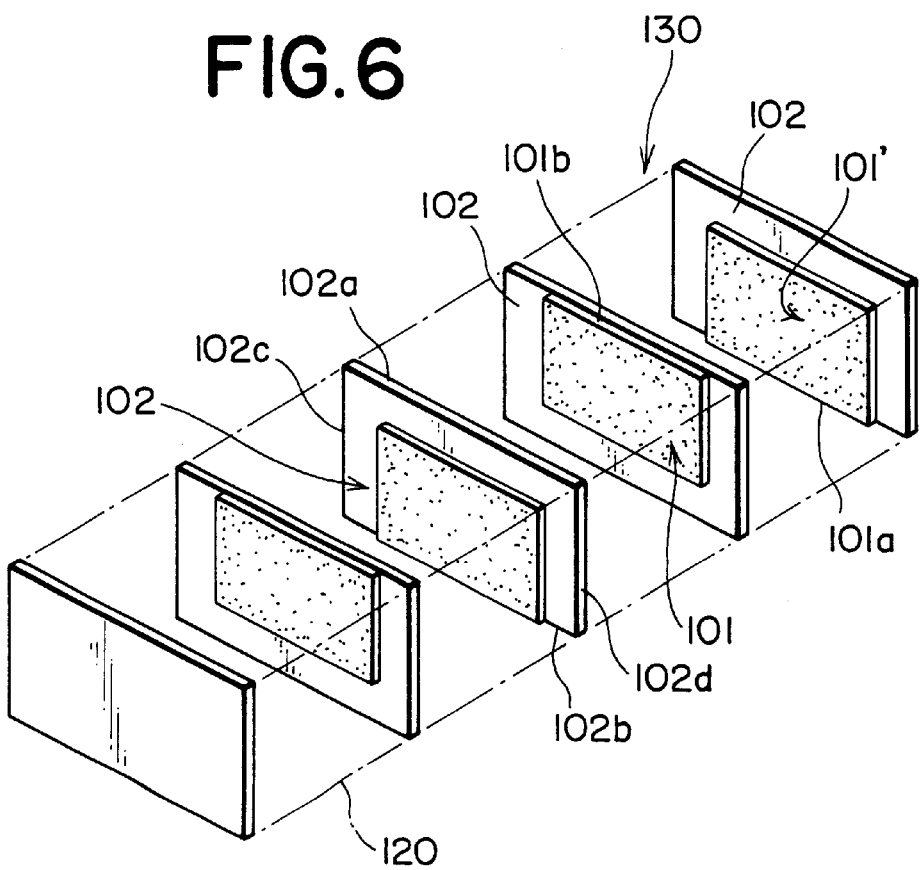
FIG. 6 is an explanatory view of a pattern shape of the internal electrodes constituting the multiterminal multilayer ceramic capacitor for three-dimensional mounting according to this embodiment.

Next, as shown in FIG. 5 to FIG. 8, the multilayer ceramic capacitor 130 for three-dimensional mounting according to the illustrated embodiment has a capacitor body 120 of a rectangular parallelopiped shape. The capacitor body 120, as shown in FIG. 5 and FIG. 6, is comprised of a plurality of first internal electrodes 101 and second internal electrodes 101' of predetermined patterns alternately stacked in the horizontal direction in the illustration via ceramic layers 102 formed in rectangular shapes. That is, in the present embodiment, as shown in FIG. 5 and FIG. 6, the plurality of first internal electrodes 101 and second internal electrodes 101' are stacked in the horizontal direction via ceramic layers 102 so that the short sides of the ceramic layers 102 register with the height direction of the capacitor body 120. Note that at least one ceramic layer 102 not formed with an internal electrode may be stacked at the two end faces of the body 120 in the stacking direction.

As shown in FIG. 6, each first internal electrode 101 has a rectangular first main portion positioned in a first face (surface) of the ceramic layer 102. Only an upper (first) long side 101$b$ of the first main portion exposes at the surface of the body 120 along a first long side 102$a$ of ceramic layer 102. The longitudinal and lateral dimensions of the first electrode 101 are set so that the other long side and two short sides of the first electrode 101 do not reach the second long side 102$b$ and two short sides 102$c$ and 102$d$ of the ceramic layer 102. The lateral width of the first electrode 101 may be a dimension of the same extent as the lateral width of the ceramic layer 102. Either of the short sides of the first electrode 101 may be exposed along the short sides 102$c$ and 102$d$ of the ceramic layer 102.

Further, each second internal electrode 101' has a rectangular second main portion along the longitudinal direction in a rear face (second face) opposite to the first main portion of the first internal electrode 101 across a ceramic layer 102. The area of the second main portion of the second internal electrode 101' is the same as the area of a first main portion of the first internal electrode 101, but only the lower (second) long side 101a of the second main portion is exposed at the bottom face of the body 120 along the second long side 102b of the ceramic layer 102. The longitudinal and lateral dimensions of the second electrode 101' are set so that the other long side and two short sides of the second electrode 101' do not reach the first long side 102a and two short sides 102c and 102d of the ceramic layer 102. The lateral width of the second electrode 101' however may be a dimension of the same extent as the lateral width of the ceramic layer 102. Either of the short sides of the second electrode 101' may be exposed along the short sides 102c and 102d of the ceramic layer 102.

As shown in FIG. 5 and FIG. 6, in the present embodiment, inside the body 120, internal electrodes 101 and 101' of the same rectangular shape but a smaller area than the ceramic layer 102 are stacked and arranged alternately at different locations in the vertical direction through ceramic layers 102. From the viewpoint of facilitating the formation of the patterns of the inner electrodes on the surfaces of the ceramic layers 102, the patterns of the internal electrodes 101 and 101' are preferably the same rectangular shapes as each other, but the present invention does not necessarily have to be the same shape.

The top face of the capacitor body 120 has attached to it a first external electrode 103 so as to be electrically connected to first internal electrodes 101 having long sides 101b exposed along the first long side 102a of the ceramic layer 102. The bottom face of the capacitor body 120 has attached to it a second external electrode 103 so as to be electrically connected to the second internal electrodes 101' having long sides 101a exposed along the second long side 102b of the ceramic layer 102. These external electrodes 103 and 104 are preferably formed over the entire top face or bottom face of the capacitor body 120, but do not necessarily have to cover the entire surface. It is also possible to determine the area covered in accordance with the shapes of the lands of the multilayer board on which the capacitor 130 is to be mounted. The area of the external electrode 103 or 104 with respect to the area of the top face or bottom face of the body where the long sides of the internal electrodes 101 and 101' are exposed is preferably an area of at least 50 percent.

These internal electrodes 101 and 101' are formed by coating and baking an Ni or other conductive paste on the surface of a ceramic green sheet and are comprised of Ni or Ni alloy layers etc. Note that the internal electrodes may also be comprised of the base metal cu, precious metal Pd or a Pd—Ag alloy layer, etc.

The ceramic layer 102 is comprised of a barium titanate-based, titanium-based, zirconate-based, or other ceramic composition. A stack of the ceramic layers 102 and internal electrodes is formed by coating a ceramic paste on a base film or other film surface to make a green sheet, printing a conductive paste on it, then stacking, cutting, and firing the green sheets. After the production of the body 120, the external electrodes are formed and baked on. The external electrodes 103 and 104 specifically can be formed by coating, drying, and baking a Cu paste on the capacitor body 120 to form an underlayer, then covering the underlayer with an Ni and Sn plating layer.

The multilayer ceramic capacitor 130 produced in this way is used for three-dimensional mounting of multiple terminals by directly connecting the first external electrodes 103 and the second external electrodes 104 to different circuit patterns of the circuit board and supplying voltages of different polarities to the adjoining external electrodes.

The specific dimensions of the multiterminal multilayer ceramic capacitor of the present embodiment are not particularly limited, but for example are a height of 0.5±0.1 mm, a width of 0.8±0.1 mm, and a length of 1.6±0.1 mm. The thickness of one ceramic layer is not particularly limited, but is for example 4 $\mu$m. The shape of the ceramic layer is that of a rectangle of short sides of 0.5±0.1 mm and long sides of 1.6±0.1 mm. The internal electrodes 101 and 101' may be formed to a thickness of 1.5 to 2.0 $\mu$m. The number of layers stacked is 160, the electrostatic capacity is for example 0.22 $\mu$F, and the distance between the external electrodes 103 and 104 can be set to a width corresponding to the short sides of the ceramic layer, that is, 0.5±0.1 mm.

Figure 7:
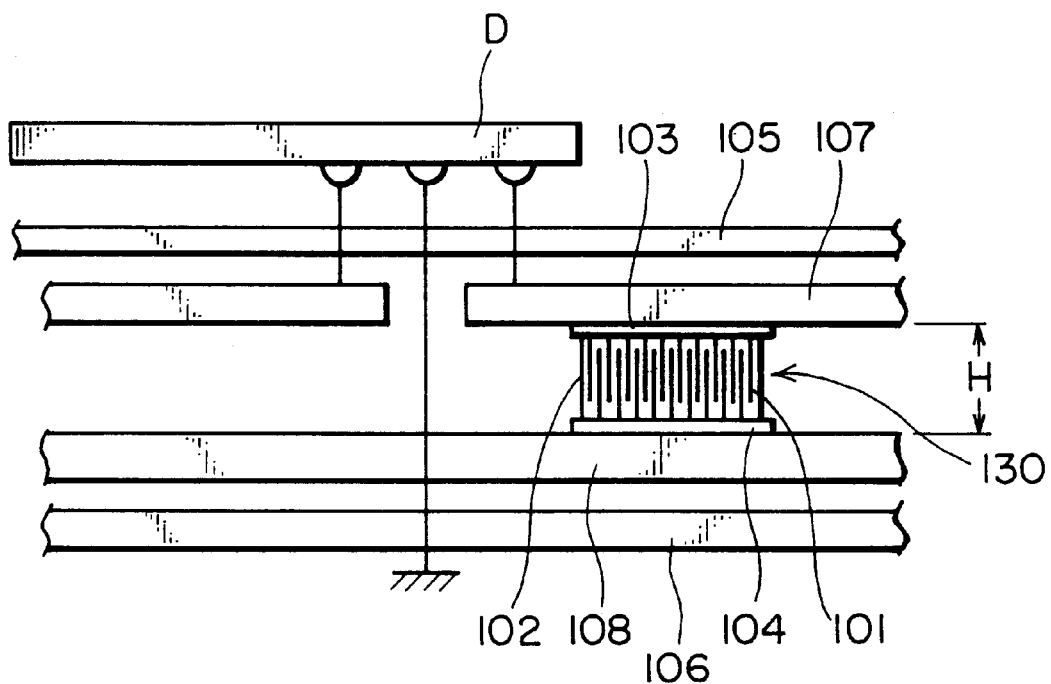
FIG. 7 is an explanatory view of a sandwiched mounting structure of a multiterminal multilayer ceramic capacitor for three-dimensional mounting according to this embodiment in a multilayer board.

The multiterminal multilayer ceramic capacitor 130 configured in this way can be mounted and sandwiched between facing circuit boards 105 and 106 in a power supply circuit provided with a semiconductor device "D" as shown in FIG. 7. This three-dimensional mounting may be performed in the following way.

That is, the external electrodes 103 and 104 of the capacitor 130 are made to directly face the different circuit patterns 107 and 108 of the circuit boards 105 and 106 and are electrically connected as a +pole/–pole (GND). In this three-dimensional mounting, the height "H" of the capacitor device as a whole can be kept low. Further, since the distance between the facing circuit boards 105 and 106 is held narrow, the detouring of the lands can be shortened and the effect of the inductance component of the circuit side can be reduced.

Figure 8:
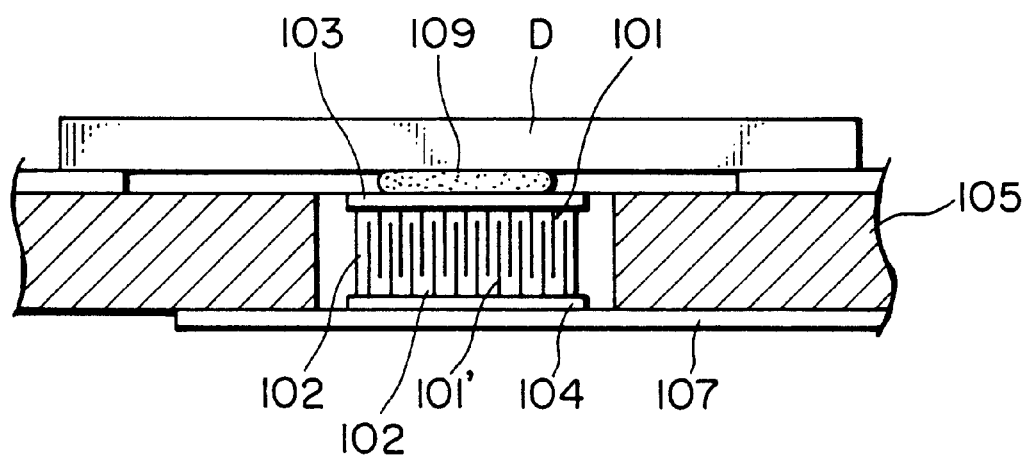
FIG. 8 is an explanatory view of a buried mounting structure of a multiterminal multilayer ceramic capacitor for three-dimensional mounting according to this embodiment in a multilayer board.

Further, as shown in FIG. 8, the capacitor 130 may be mounted three-dimensionally. In this example, the terminal of the semiconductor "D" and one external electrode 103 of the capacitor 130 are connected by solder 109 etc., and the other external electrode 104 is electrically connected with the circuit pattern 107 in an opening formed in the circuit board 105.

To reduce the inductance of the circuit pattern, by burying the multilayer ceramic capacitor 130 having an ESL value of 10 to 20 pH and an ESR value of a low 5 to 7 m$\Omega$ in the circuit board 5, the inductance component of the lands can be ignored.

If comparing the ESL and ESR of a multilayer ceramic capacitor of the prior art with an electrostatic capacity of 0.22 $\mu$F and a multilayer ceramic capacitor according to the present embodiment, if the value of the multilayer ceramic capacitor according to the prior art is 100 percent, the multilayer ceramic capacitor according to the present embodiment can be made a low 2 to 3 percent in value.

This is because in the multilayer ceramic capacitor according to the present embodiment, since the distance between external electrodes 103 and 104 can be set short and the height of the capacitor device as a whole can be kept low, even if the capacitor of the present embodiment is mounted on a multilayer board, the total inductance due to the detouring of the lands can be reduced and the lands formed on the multilayer board can be simplified.

Third Embodiment

Figure 9:
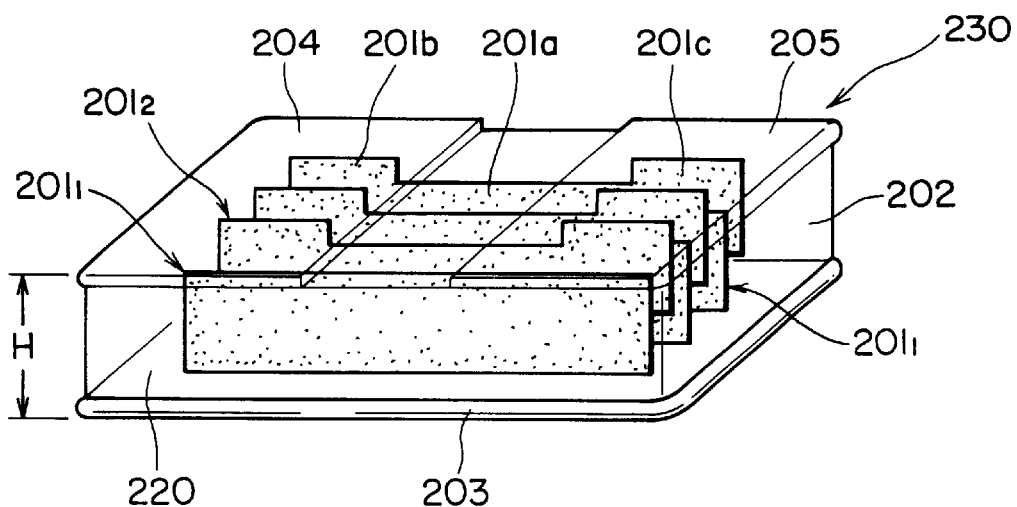
FIG. 9 is a perspective view of a three-terminal multilayer ceramic capacitor for three-dimensional mounting according to another embodiment of the present invention in a state showing the internal structure.
Figure 10:
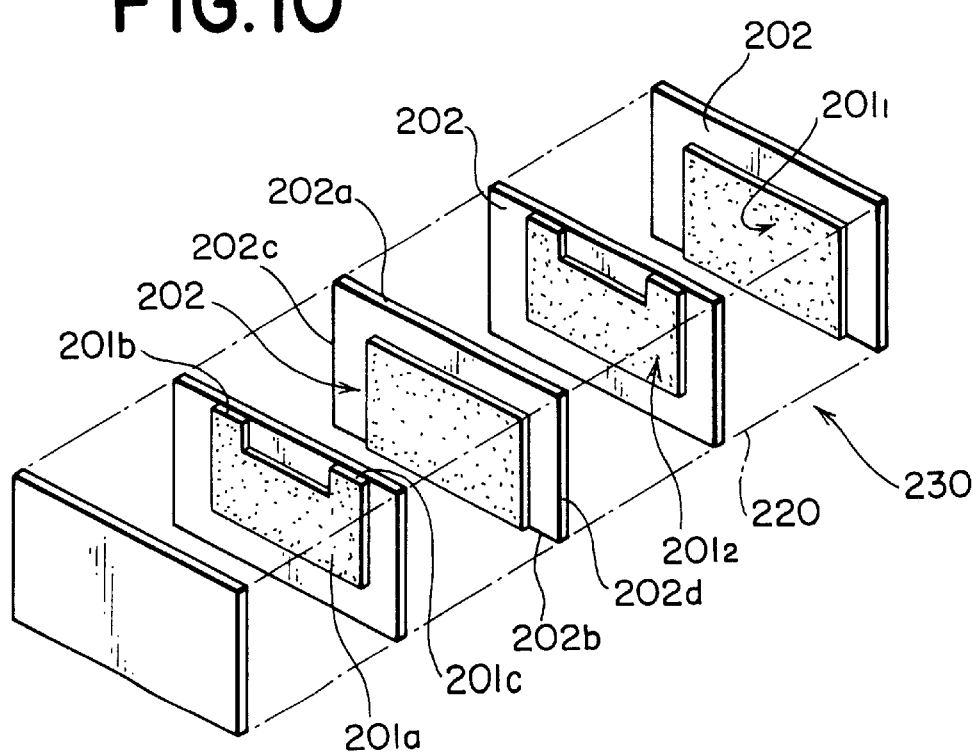
FIG. 10 is an explanatory view of the pattern shape of the internal electrodes constituting the three-terminal multilayer ceramic capacitor for three-dimensional mounting according to this embodiment.

Next, as shown in FIG. 9 to FIG. 12, the multilayer ceramic capacitor 230 for three-dimensional mounting according to the illustrated embodiment has a capacitor body 220 of a rectangular parallelopiped shape. The capacitor body 220, as shown in FIG. 9 and FIG. 10, is comprised of a plurality of first internal electrodes $201_1$ and second internal electrodes $201_2$ of predetermined patterns alternately stacked in the horizontal direction in the illustration via ceramic layers 202 formed in rectangular shapes. That is, in the present embodiment, as shown in FIG. 9 and FIG. 10, the plurality of first internal electrodes $201_1$ and second internal electrodes $201_2$ are stacked in the horizontal direction via ceramic layers 202 so that the short sides of the ceramic layers 202 register with the height direction of the capacitor body 220. Note that at least one ceramic layer 202 not formed with an internal electrode may be stacked at the two end faces of the body 220 in the stacking direction.

As shown in FIG. 10, each first internal electrode $201_1$ has a rectangular first main portion positioned in a first face (surface) of the ceramic layer 202. Only a lower (first) long side of the first main portion exposes at the bottom surface of the body 220 along a first long side 202b of ceramic layer 202. The longitudinal and lateral dimensions of the first electrode $201_1$ are set so that the other long side and two short sides of the first electrode $201_1$ do not reach the second long side 202a and two short sides 202c and 202d of the ceramic layer 202. The lateral width of the first electrode $201_1$ may be a dimension of the same extent as the lateral width of the ceramic layer 202. Either of the short sides of the first electrode $201_1$ may be exposed along the short sides 202c and 202d of the ceramic layer 202.

Further, each second internal electrode $201_2$ has a rectangular second main portion 201a along the longitudinal direction in a rear face (second face) opposite to the first main portion of the first internal electrode $201_1$ across the ceramic layer 202. The second main portion 201a is formed with a pair of leads 201b and 201c exposed by extending from the upper (second) long side to the second long side 202a of the ceramic layer 202. These leads 201b and 201c are formed so as to project out upward from the two end of the long side of the rectangular second main portion 201a.

The longitudinal and lateral dimensions of the second electrode $201_2$ are set so that the other long side and two short sides of the second main portion 201a of the second electrode $201_1$ do not reach the first long side 202b and two short sides 202c and 202d of the ceramic layer 202. The lateral width of the second electrode $201_2$ however may be a dimension of the same extent as the lateral width of the ceramic layer 202. Either of the short sides of the second electrode $201_2$ may be exposed along the short sides 202c and 202d of the ceramic layer 202.

As shown in FIG. 9 and FIG. 10, in the present embodiment, inside the body 220, internal electrodes $201_1$ and $201_2$ are stacked and arranged alternately at different locations in the vertical direction through ceramic layers 202.

Figure 11:
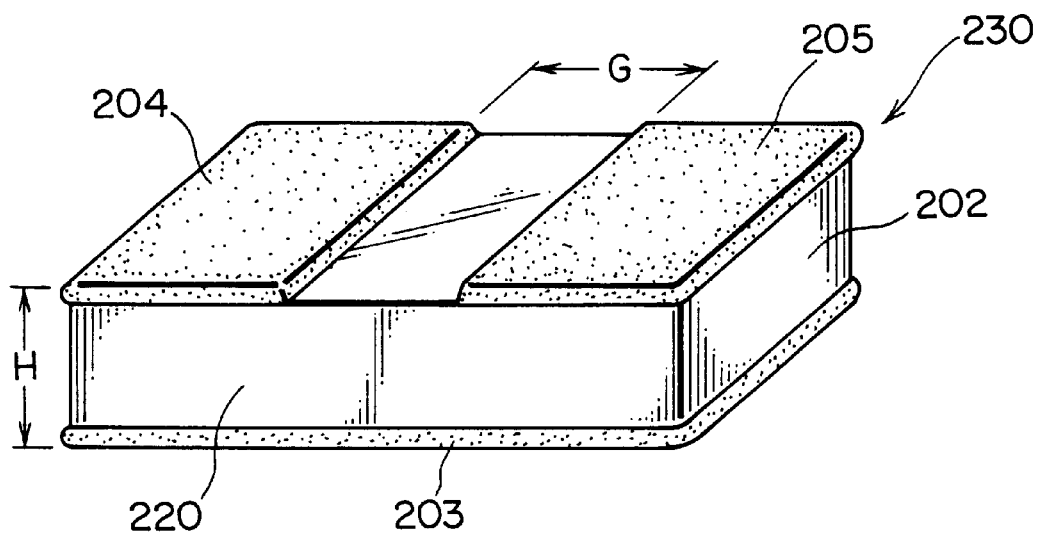
FIG. 11 is a perspective view of the appearance including external electrodes of the three-terminal multilayer ceramic capacitor for three-dimensional mounting according to this embodiment.

As shown in FIG. 11, the bottom face of the capacitor body 220 has attached to it a first external electrode 203 so as to be electrically connected to a first internal electrodes $201_1$ having long side exposed along a first long side 202b of the ceramic layer 202. The top face of the capacitor body 220 has attached to it a pair of second external electrodes 204 and 205 so as to be electrically connected to second internal electrodes $201_2$ having leads 201b and 201c exposed along a second long side 202a of the ceramic layer 202. The external electrode 203 is preferably formed over the entire bottom face of the capacitor body 220, but does not necessarily have to cover the entire surface. It is also possible to determine the area covered in accordance with the shapes of the lands of the multilayer board on which the capacitor 230 is to be mounted. The area of the first external electrode 203 with respect to the area of the bottom face of the body 220 where the long sides of the first internal electrodes $201_1$ are exposed is preferably an area of at least 50 percent.

These internal electrodes $201_1$ and $201_2$ are formed by coating and baking an Ni or other conductive paste on the surface of a ceramic green sheet and are comprised of Ni or Ni alloy layers etc. Note that the internal electrodes may also be comprised of the base metal Cu, precious metal Pd or a Pd—Ag alloy layer, etc.

The ceramic layer 202 is comprised of a barium titanate-based, titanium-based, zirconate-based, or other ceramic composition. A stack of the ceramic layers 202 and internal electrodes is formed by coating a ceramic paste on a base film or other film surface to make a green sheet, printing a conductive paste on it, then stacking, cutting, and firing the green sheets. After the production of the body 220, the external electrodes are formed and baked on. The external electrodes 203, 204, and 205 specifically can be formed by coating, drying, and baking a Cu paste on the capacitor body 220 to form an underlayer, then covering the underlayer with an Ni and Sn plating layer.

The multilayer ceramic capacitor 230 produced in this way is used for three-dimensional mounting of multiple terminals by directly connecting the first external electrode 203 and the second external electrode 204 and 205 to different circuit patterns of the circuit board and supplying voltages of different polarities to the adjoining external electrodes.

The specific dimensions of the multiterminal multilayer ceramic capacitor of the present embodiment are not particularly limited, but for example are a height of 0.5±0.1 mm, a width of 0.8±0.1 mm, and a length of 1.6±0.1 mm. The thickness of one ceramic layer is not particularly limited, but is for example 4 μm. The shape of the ceramic layer is that of a rectangle of short sides of 0.5±0.1 mm and long sides of 1.6±0.1 mm. The internal electrodes $201_1$ and $201_2$ may be formed to a thickness of 1.5 to 2.0 μm. The distance "H" between the external electrodes 203 and 204 and the distance "G" between the second electrodes can be set to a width corresponding to the short sides of the ceramic layer, that is, 0.5±0.1 mm.

Figure 12:
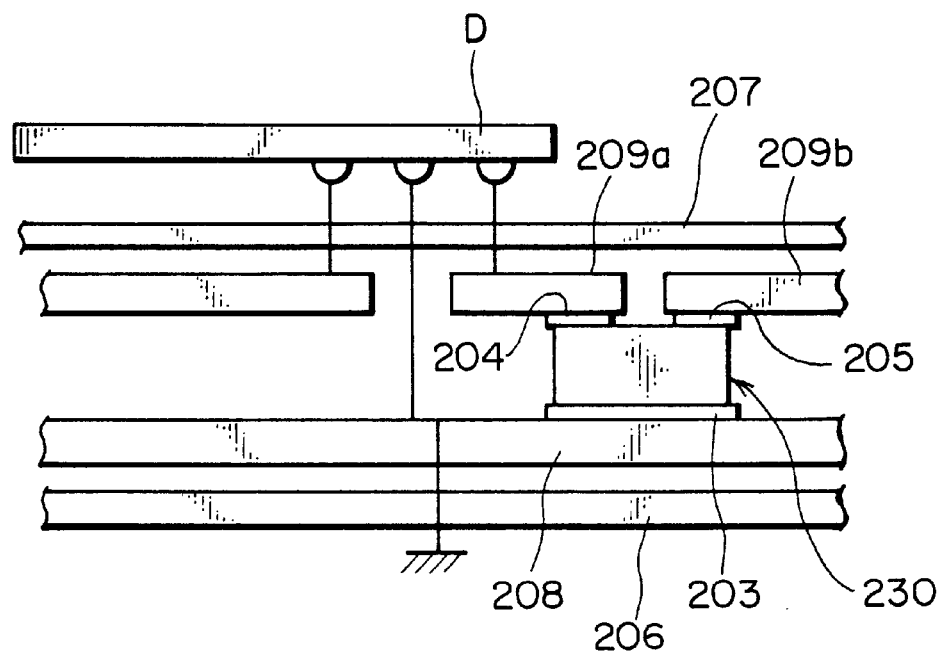
FIG. 12 is an explanatory view of a sandwiched mounting structure of a three-terminal multilayer ceramic capacitor for three-dimensional mounting according to this embodiment in a multilayer board.

The three-terminal multilayer ceramic capacitor 230 configured in this way can be mounted sandwiched between facing circuit boards 206 and 207 in a power supply circuit provided with a semiconductor device "D" as shown in FIG. 12. This three-dimensional mounting may be performed in the following way.

That is, the external electrodes 203, 204, and 205 are made to directly face the different circuit patterns 208, 209a, and 209b of the circuit boards 205 and 206 and are electrically connected as a +pole/−pole (GND). In this three-dimensional mounting, the height "H" of the capacitor device as a whole can be kept low and, further, the distance between the facing circuit boards 206 and 207 is held narrow. Therefore, the detouring of the lands can be shortened and the effect of the inductance component of the circuit side can be reduced.

To reduce the inductance of the circuit pattern, by burying the multilayer ceramic capacitor 230 having an ESL value of 10 to 20 pH and an ESR value of a low 5 to 7 mΩ, the inductance component of the lands can be ignored. Due to this, if comparing the ESL and ESR of a multilayer ceramic capacitor of the prior art with an electrostatic capacity of 0.22 μF and a multilayer ceramic capacitor according to the present embodiment (same electrostatic capacity as the prior art), if the value of the multilayer ceramic capacitor according to the prior art is 100 percent, the multilayer ceramic capacitor according to the present embodiment can be made a low 2 to 3 percent in value.

This is because in the multilayer ceramic capacitor according to the present embodiment, the distance between external electrodes 203, 204, and 205 can be set short and the height of the capacitor device as a whole can be kept low and the external electrode 203 is broad and connection to the land is easy. Further, even if the capacitor 230 is mounted on a multilayer board, the total inductance due to the detouring of the lands can be reduced and the lands formed on the multilayer board can be simplified.

Fourth Embodiment

Figure 13:
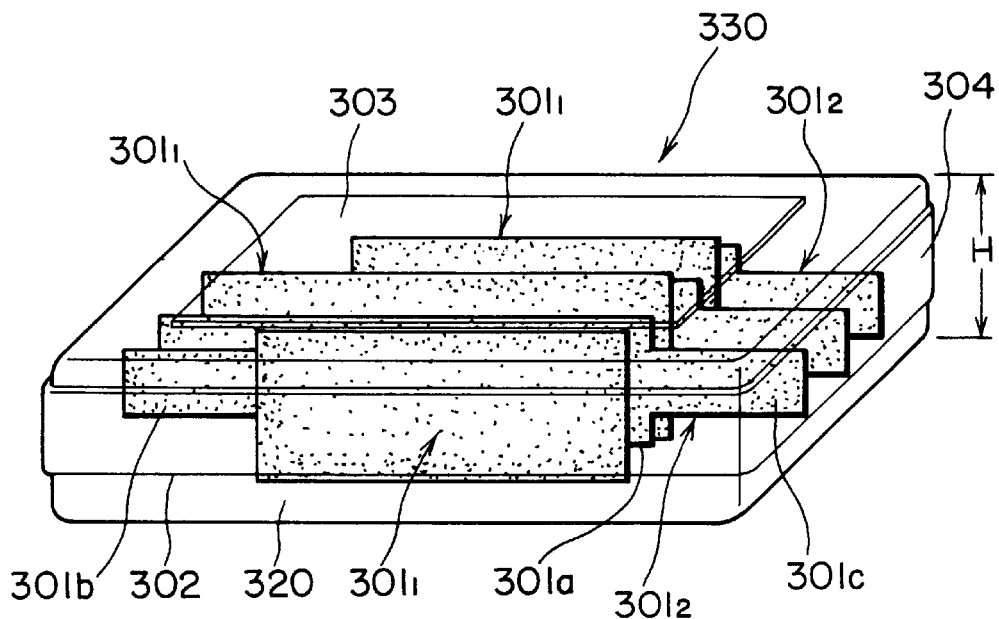
FIG. 13 is a perspective view of a through-hole type multilayer ceramic capacitor for three-dimensional mounting according to another embodiment of the present invention in a state showing the internal structure.
Figure 14:
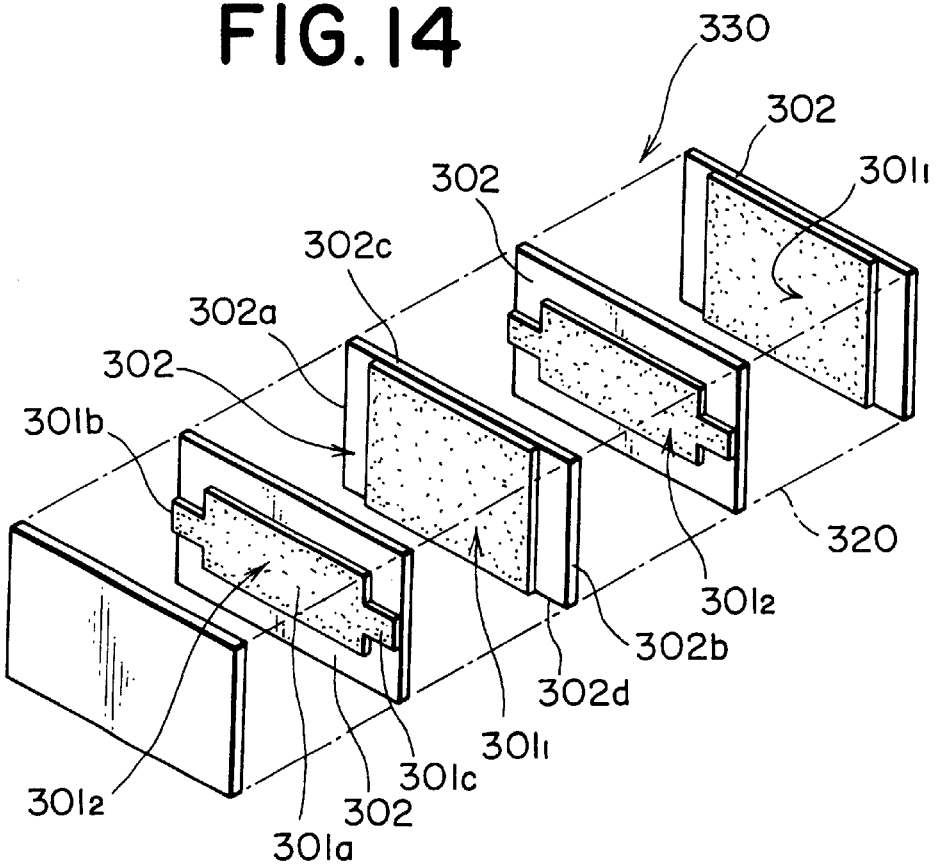
FIG. 14 is an explanatory view of the pattern shape of the internal electrodes constituting the through-hole type multilayer ceramic capacitor for three-dimensional mounting according to this embodiment.
Figure 15:
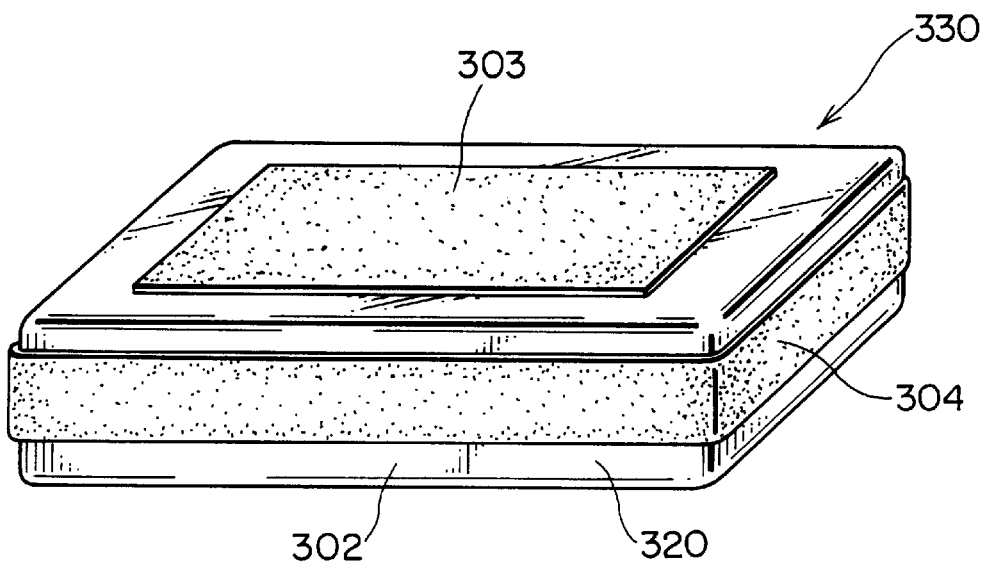
FIG. 15 is a perspective view of the appearance including external electrodes of the through-hole type multilayer ceramic capacitor for three-dimensional mounting according to this embodiment.

Next, explaining this embodiment by reference to FIG. 13 to FIG. 16, the through-hole type multilayer ceramic capacitor 330 for three-dimensional mounting according to the illustrated embodiment has a capacitor body 320 of a rectangular parallelopiped shape. The capacitor body 320, as shown in FIG. 13 and FIG. 14, is comprised of a plurality of first internal electrodes $301_1$ and second internal electrodes $301_2$ of predetermined patterns alternately stacked in the horizontal direction in the illustration via ceramic layers 302 formed in rectangular shapes. That is, in the present embodiment, as shown in FIG. 13 and FIG. 14, the plurality of first internal electrodes $301_1$ and second internal electrodes $301_2$ are stacked in the horizontal direction via ceramic layers 302 so that the short sides of the ceramic layers 302 register with the height direction of the capacitor body 320. Note that at least one ceramic layer 302 not formed with an internal electrode may be stacked at the two end faces of the body 320 in the stacking direction.

As shown in FIG. 13 and FIG. 14, each first internal electrode $301_1$ has a rectangular first main portion positioned in a first face (surface) of the ceramic layer 302. The two long sides of the first main portion expose at the surfaces of the body 320 along the two long sides 302c and 302d of the ceramic layer 302. The longitudinal and lateral dimensions of the first electrode $301_1$ are set so that the two short sides of the first electrode $301_1$ do not reach the two short sides 302a and 302b of the ceramic layer 302.

Further, each second internal electrode $301_2$ has a rectangular second main portion 301a along the longitudinal direction in a rear face (second face) opposite to the first main portion of the first internal electrode $301_1$ across a ceramic layer 302. The second main portion 301a is formed with a pair of leads 301b and 301c exposed by extending from the two short sides to the short sides 302a and 302b of the ceramic layer 302. These leads 301b and 301c are formed so as to project out from the approximate center of the short sides of the rectangular second main portion 301a toward the two sides 302a and 302b. The dimensions of the short sides of the second main portion 301a are set so that the long sides of the rectangular second main portion 301a do not reach the long sides 302c and 302d of the ceramic layer 302. Note that the vertical width (width of height direction of body) of the leads 301b and 301c are smaller than the vertical width of the portion 301a in the illustrated example, but may also be the same width.

In the present embodiment, as shown in FIG. 13 and FIG. 14, inside the body 320, internal electrodes $301_1$ and $301_2$ are stacked and arranged alternately via ceramic layers 302.

Figure 16:
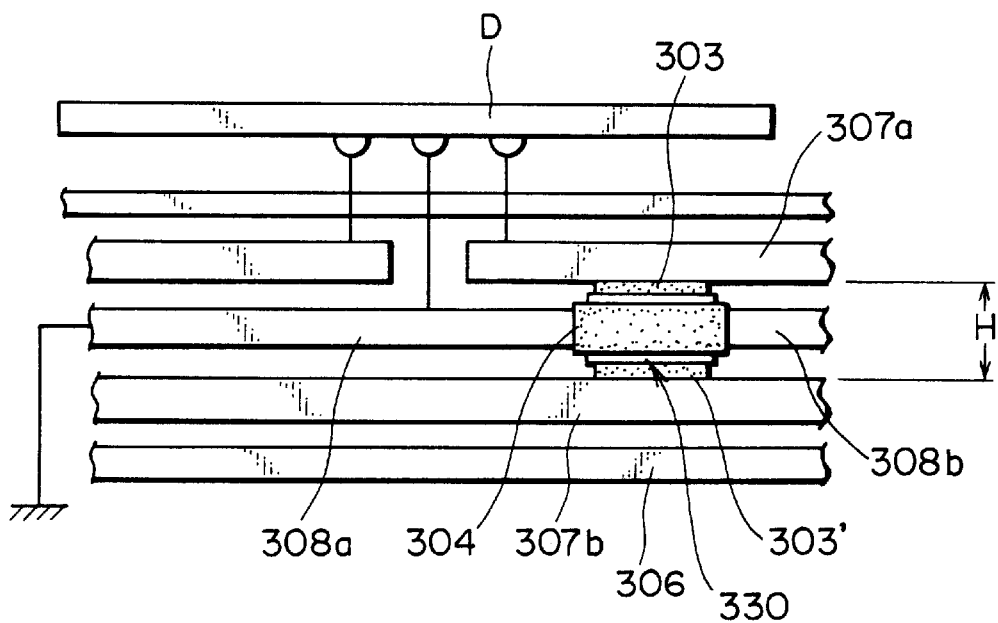
FIG. 16 is an explanatory view of a sandwiched mounting structure of a through-hole type multilayer ceramic capacitor for three-dimensional mounting according to this embodiment in a multilayer board.

As shown in FIG. 13 and FIG. 16, the top face and bottom face of the capacitor body 320 have attached to it first external electrodes 303 and 303' so as to be electrically connected to first internal electrodes $301_1$ having long sides exposed along the long sides 302a and 302d of the ceramic layer 302. The circumference of the side faces of the capacitor body 320 has attached to it a strip-like second external electrode 304 so as to be electrically connected to second internal electrodes $301_2$ having leads 301c and 301d exposed along the short sides 302a and 302b of the ceramic layer 302.

The first external electrode 303 or 303' is preferably formed over the entire top face or bottom face of the capacitor body 320, but does not necessarily have to cover the entire surface. It is also possible to determine the area covered in accordance with the shapes of the lands of the multilayer board on which the capacitor 330 is to be mounted. The area of the first external electrode 303 or 303' with respect to the area of the top face or bottom face of the body 320 where the long sides of the first internal electrodes $301_1$ are exposed is preferably an area of at least 50 percent.

These internal electrodes $301_1$ and $301_2$ are formed by coating and baking an Ni or other conductive paste on the surface of a ceramic green sheet and are comprised of Ni or Ni alloy layers etc. Note that the internal electrodes may also be comprised by the base metal Cu, precious metal Pd or a Pd—Ag alloy layer, etc.

The ceramic layer 302 is comprised of a barium titanate-based, titanium-based, zirconate-based, or other ceramic composition. A stack of the ceramic layers 302 and internal electrodes is formed by coating a ceramic paste on a base film or other film surface to make a green sheet, printing a conductive paste on it, then stacking, cutting, and firing the green sheets. After the production of the body 320, the external electrodes are formed and baked on. The external electrodes 303, 303', and 304 specifically can be formed by coating, drying, and baking a Cu paste on the capacitor body 320 to form an underlayer, then covering the underlayer with an Ni and Sn plating layer.

The multilayer ceramic capacitor 330 produced in this way is used for three-dimensional mounting of multiple terminals by directly connecting the first external electrodes 303 and 303' and the second external electrode 304 to different circuit patterns of the circuit board and supplying voltages of different polarities to the adjoining external electrodes.

The specific dimensions of the multiterminal multilayer ceramic capacitor of the present embodiment are not particularly limited, but for example are a height of 0.5±0.1 mm, a width of 0.8±0.1 mm, and a length of 1.6±0.1 mm. The thickness of one ceramic layer is not particularly limited, but is for example 4 μm. The shape of the ceramic layer is that of a rectangle of short sides of 0.5±0.1 mm and long sides of 1.6±0.1 mm. The internal electrodes $301_1$ and $301_2$ may be formed to a thickness of 1.5 to 2.0 μm. The distance "H" between the external electrodes 303 and 303' can be set to a width corresponding to the short sides of the ceramic layers 302, that is, 0.5±0.1 mm.

The through-hole type multilayer ceramic capacitor 330 configured in this way can be mounted sandwiched between facing circuit boards 305 and 306 in a power supply circuit provided with a semiconductor device "D" as shown in FIG. 16. This three-dimensional mounting may be performed in the following way.

That is, the vertically facing external electrodes 303 and 303' are made to directly face the different circuit patterns 307a and 307b of the circuit boards 305 and 306 or the external electrode 304 extending across the entire circumference of the side faces is made to directly face the separate circuit patterns 308a and 308b and these are electrically connected as a +pole/−pole (GND). In this three-dimensional mounting, the height "H" of the capacitor device as a whole can be kept low and, further, the distance between the facing circuit boards 305 and 306 is held narrow. Therefore, the detouring of the lands can be shortened and the effect of the inductance component can be reduced.

To reduce the inductance of the circuit pattern, by burying the multilayer ceramic capacitor 330 having an ESL value of 10 to 20 pH and an ESR value of a low 5 to 7 mΩ, the inductance component of the lands can be ignored. Due to this, if comparing the ESL and ESR of a multilayer ceramic capacitor of the prior art with an electrostatic capacity of 0.22 μF and a multilayer ceramic capacitor according to the present embodiment (same electrostatic capacity as the prior art), if the value of the multilayer ceramic capacitor according to the prior art is 100 percent, the multilayer ceramic capacitor according to the present embodiment can be made a low 2 to 3 percent in value.

This is because in the multilayer ceramic capacitor according to the present embodiment, the distance between external electrodes 303, 303', and 304 can be set short and the height of the capacitor device as a whole can be kept low. Further, the external electrode 303 is broad and connection to the land is easy, therefore, even if the capacitor is mounted on a multilayer board, the total inductance due to the detouring of the lands can be reduced and the lands formed on the multilayer board can be simplified.

Note that the present invention is not limited to the above-mentioned embodiments and may be changed in various ways within the scope of the present invention.

What is claimed is:

1. A multilayer ceramic capacitor for three-dimensional mounting comprising:

at least one ceramic layer formed in a rectangular shape;

a first internal electrode having a rectangular first main portion extending along a longitudinal direction in a first face of the at least one ceramic layer and having a plurality of first leads extending from long sides of the first main portion to long sides of the at least one ceramic layer;

a second internal electrode having a second main portion opposing against the first main portion of the first internal electrode via the at least one ceramic layer and located in a second face of the at least one ceramic layer opposite to the first face and having a plurality of second leads extending from long sides of the second main portion at positions different from the first leads provided at the first internal electrode to the long sides of the at least one ceramic layer;

a rectangular parallelepiped shaped capacitor body comprised of a plurality of first internal electrodes and second internal electrodes stacked via the at least one ceramic layer so that a short side of at least one ceramic layer registers with a height direction of the capacitor body;

first external electrodes formed at a top face and bottom face of the capacitor body and electrically connected to first leads positioned in the same lines along the stacking direction of the at least one ceramic layer;

second external electrodes alternately formed with respect to the first external electrodes at the top face and bottom face of the capacitor body and electrically connected to second leads positioned in the same lines along the stacking direction of the at least one ceramic layer.

2. The multilayer ceramic capacitor for three-dimensional mounting as set forth in claim 1, wherein the first external electrodes are connected to a first circuit pattern outside of the capacitor body and the second external electrodes are connected to a second circuit pattern different from the first circuit pattern.

3. The multilayer ceramic capacitor for three-dimensional mounting as set forth in claim 1, wherein the multilayer ceramic capacitor is buried in a three-dimensional circuit board.

4. A multilayer ceramic capacitor for three-dimensional mounting comprising:

at least one ceramic layer formed in a rectangular shape;

a first internal electrode having a rectangular first main portion extending along a longitudinal direction in a first face of the at least one ceramic layer and having a first long side of the first main portion exposed along a first long side of the at least one ceramic layer;

a second internal electrode having a rectangular second main portion extending along a longitudinal direction in a second face opposite of the ceramic layer opposite to the first face and having a second long side of the second main portion exposed along a second long side of the ceramic layer a rectangular parallelepiped shaped capacitor body comprised of a plurality of first internal electrodes and second internal electrodes stacked via the at least one ceramic layer so that the short sides of the at least one ceramic layer registers with a height direction of the capacitor body;

first external electrodes formed at a top face or bottom face of the capacitor body and electrically connected to the first internal electrode exposed along the first long side of the at least one ceramic layer;

second external electrodes formed at the top face or bottom face of the capacitor body and electrically connected to the second internal electrode exposed along the second long side of the at least one ceramic layer.

5. The multilayer ceramic capacitor for three-dimensional mounting as set forth in claim 4, wherein the first external electrodes are connected to a first circuit pattern outside of the capacitor body and the second external electrodes are connected to a second circuit pattern different from the first circuit pattern.

6. The multilayer ceramic capacitor for three-dimensional mounting as set forth in claim 4, wherein the multilayer ceramic capacitor is buried in a three-dimensional circuit board.

7. A multilayer ceramic capacitor for three-dimensional mounting comprising:

at least one ceramic layer formed in a rectangular shape;

a first internal electrode having a rectangular first main portion extending along a longitudinal direction in a first face of the at least one ceramic layer and having a first long side of the first main portion exposed along a first long side of the at least one ceramic layer;

a second internal electrode having a rectangular second main portion extending along a longitudinal direction in a second face of the at least one ceramic layer opposite to the first face and having a plurality of leads extending from a second long side of the second main portion to a second long side of the ceramic layer;

a rectangular parallelepiped shaped capacitor body comprised of a plurality of first internal electrodes and second internal electrodes stacked via the at least one ceramic layer so that a short side of the at least one ceramic layer registers with a height direction of the capacitor body;

a first external electrode formed at a top face or bottom face of the capacitor body and electrically connected to the first internal electrode exposed along the first long side of the at least one ceramic layer;

second external electrodes formed at the top face or bottom face of the capacitor body and electrically connected to the leads exposed along the second long side of the at least one ceramic layer.

8. The multilayer ceramic capacitor for three-dimensional mounting as set forth in claim 7, wherein the plurality of second external electrodes are arranged at the top face or bottom face of the capacitor body at a distance substantially corresponding to each short side of the at least one ceramic layer.

9. The multilayer ceramic capacitor for three-dimensional mounting as set forth in claim 7, wherein the first external electrode is connected to a first circuit pattern outside of the capacitor body and the second external electrodes are connected to a second circuit pattern different from the first circuit pattern.

10. The multilayer ceramic capacitor for three-dimensional mounting as set forth in claim 7, wherein the multilayer ceramic capacitor is buried in a three-dimensional circuit board.

11. A multilayer ceramic capacitor for three-dimensional mounting comprising:

at least one ceramic layer formed in a rectangular shape;

a first internal electrode having a rectangular first main portion extending along a longitudinal direction in a first face of the at least one ceramic layer and having two long sides of the first main portion exposed respectively along long sides of the ceramic layer;

a second internal electrode having a rectangular second main portion extending along a longitudinal direction in a second face of the at least one ceramic layer opposite to the first face and having a pair of leads extending respectively from short sides of the second main portion to short sides of the at least one ceramic layer;

a rectangular parallelepiped shaped capacitor body comprised of a plurality of first internal electrodes and second internal electrodes stacked via the at least one ceramic layer so that the short sides of the at least one ceramic layer registers with a height direction of the capacitor body;

a pair of first external electrodes formed at a top face and bottom face of the capacitor body and electrically connected to the first internal electrode exposed toward the long sides of the at least one ceramic layer;

a second external electrode formed at the side faces of the capacitor body and electrically connected to the leads exposed toward the short sides of the at least one ceramic layer.

12. The multilayer ceramic capacitor for three-dimensional mounting as set forth in claim 11, wherein the second external electrode extends in a strip along the entire circumference of the four side faces of the capacitor body.

13. The multilayer ceramic capacitor for three-dimensional mounting as set forth in claim 11, wherein the first external electrodes are connected to a first circuit pattern outside of the capacitor body and the second external electrode is connected to a second circuit pattern different from the first circuit pattern.

14. The multilayer ceramic capacitor for three-dimensional mounting as set forth in claim 11, wherein the multilayer ceramic capacitor is buried in a three-dimensional circuit board.

15. The multilayer ceramic capacitor for three-dimensional mounting as set forth in claim 14, wherein the first external electrodes and second external electrode of the multilayer ceramic capacitor are connected directly to the circuit pattern formed in the three-dimensional circuit board.

* * * * *